United States Patent
Yang

(10) Patent No.: US 12,080,787 B2
(45) Date of Patent: Sep. 3, 2024

(54) HIGH ELECTRON MOBILITY TRANSISTOR AND METHOD FOR FABRICATING THE SAME

(71) Applicant: UNITED MICROELECTRONICS CORP., Hsin-Chu (TW)

(72) Inventor: Po-Yu Yang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 397 days.

(21) Appl. No.: 17/671,549

(22) Filed: Feb. 14, 2022

(65) Prior Publication Data
US 2023/0231044 A1    Jul. 20, 2023

(30) Foreign Application Priority Data
Jan. 14, 2022   (CN) .......................... 202210041535.8

(51) Int. Cl.
*H01L 29/778*     (2006.01)
*H01L 21/02*      (2006.01)
*H01L 29/66*      (2006.01)

(52) U.S. Cl.
CPC ...... *H01L 29/7786* (2013.01); *H01L 21/0217* (2013.01); *H01L 29/66462* (2013.01)

(58) Field of Classification Search
CPC ............ H01L 21/0217; H01L 29/7786; H01L 29/66462
USPC .......................................................... 257/194
See application file for complete search history.

(56) References Cited

U.S. PATENT DOCUMENTS 9,960,266 B2    5/2018  Tadjer et al.
2011/0180854 A1*  7/2011  Ramdani ............... H01L 29/225
                                                257/E21.403

FOREIGN PATENT DOCUMENTS

CN          112614835 A  *  4/2021  ......... H01L 21/8252

\* cited by examiner

*Primary Examiner* — Igwe U Anya
(74) *Attorney, Agent, or Firm* — Winston Hsu

(57) ABSTRACT

A method for fabricating a high electron mobility transistor (HEMT) includes the steps of first forming a buffer layer on a substrate, forming a barrier layer on the buffer layer, forming a p-type semiconductor layer on the barrier layer, forming a compressive stress layer adjacent to one side of the p-type semiconductor layer, and then forming a tensile stress layer adjacent to another side of the p-type semiconductor layer.

12 Claims, 4 Drawing Sheets

HIGH ELECTRON MOBILITY TRANSISTOR AND METHOD FOR FABRICATING THE SAME

BACKGROUND OF THE INVENTION

1. Field of the Invention

The invention relates to a high electron mobility transistor (HEMT) and method for fabricating the same.

2. Description of the Prior Art

High electron mobility transistor (HEMT) fabricated from GaN-based materials have various advantages in electrical, mechanical, and chemical aspects of the field. For instance, advantages including wide band gap, high break down voltage, high electron mobility, high elastic modulus, high piezoelectric and piezoresistive coefficients, and chemical inertness. All of these advantages allow GaN-based materials to be used in numerous applications including high intensity light emitting diodes (LEDs), power switching devices, regulators, battery protectors, display panel drivers, and communication devices.

SUMMARY OF THE INVENTION

According to an embodiment of the present invention, a method for fabricating a high electron mobility transistor (HEMT) includes the steps of first forming a buffer layer on a substrate, forming a barrier layer on the buffer layer, forming a p-type semiconductor layer on the barrier layer, forming a compressive stress layer adjacent to one side of the p-type semiconductor layer, and then forming a tensile stress layer adjacent to another side of the p-type semiconductor layer.

According to another aspect of the present invention, a high electron mobility transistor (HEMT) includes a buffer layer on a substrate, a barrier layer on the buffer layer, a p-type semiconductor layer on the barrier layer, a compressive stress layer adjacent to one side of the p-type semiconductor layer, and a tensile stress layer adjacent to another side of the p-type semiconductor layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
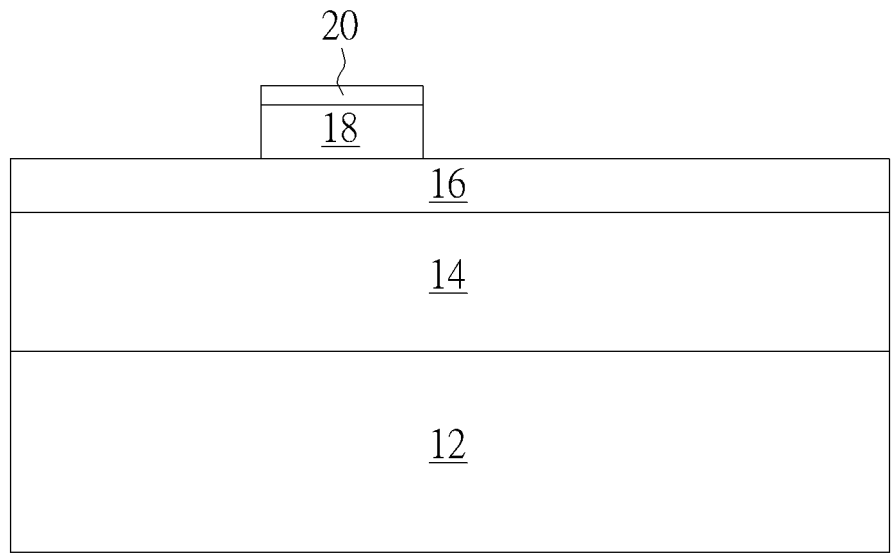
FIGS. 1-7 illustrate a method for fabricating a HEMT according to an embodiment of the present invention.

Referring to the FIGS. 1-7, FIGS. 1-7 illustrate a method for fabricating a HEMT according to an embodiment of the present invention. As shown in the FIG. 1, a substrate 12 such as a substrate made from silicon, silicon carbide, or aluminum oxide (or also referred to as sapphire) is provided, in which the substrate 12 could be a single-layered substrate, a multi-layered substrate, gradient substrate, or combination thereof. According to other embodiment of the present invention, the substrate 12 could also include a silicon-on-insulator (SOI) substrate.

Next, a selective nucleation layer (not shown) and a buffer layer 14 are formed on the substrate 12. According to an embodiment of the present invention, the nucleation layer preferably includes aluminum nitride (AlN) and the buffer layer 14 is preferably made of III-V semiconductors such as gallium nitride (GaN), in which a thickness of the buffer layer 16 could be between 0.5 microns to 10 microns. According to an embodiment of the present invention, the formation of the buffer layer 14 on the substrate 12 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Next, an unintentionally doped (UID) buffer layer (not shown) could be formed on the surface of the buffer layer 16. In this embodiment, the UID buffer layer is preferably made of III-V semiconductors such as gallium nitride (GaN) or more specifically unintentionally doped GaN. According to an embodiment of the present invention, the formation of the UID buffer layer on the buffer layer 14 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Next, a barrier layer 16 is formed on the surface of the UID buffer layer or buffer layer 14. In this embodiment, the barrier layer 16 is preferably made of III-V semiconductor such as n-type or n-graded aluminum gallium nitride ($Al_xGa_{1-x}N$), in which 0<x<1, the barrier layer 16 preferably includes an epitaxial layer formed through epitaxial growth process, and the barrier layer 16 could include dopants such as silicon or germanium. Similar to the buffer layer 14, the formation of the barrier layer 16 on the buffer layer 14 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Next, a p-type semiconductor layer 18 and a passivation layer 20 are formed on the barrier layer 16, and then a photo-etching process is conducted to remove part of the passivation layer 20 and part of the p-type semiconductor layer 18. In this embodiment, the p-type semiconductor layer 18 is a III-V compound semiconductor layer preferably including p-type GaN (pGaN) and the formation of the p-type semiconductor layer 18 on the barrier layer 16 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof. The passivation layer 20 on the other hand includes metal nitride including but not limited to for example titanium nitride (TiN).

Figure 2:
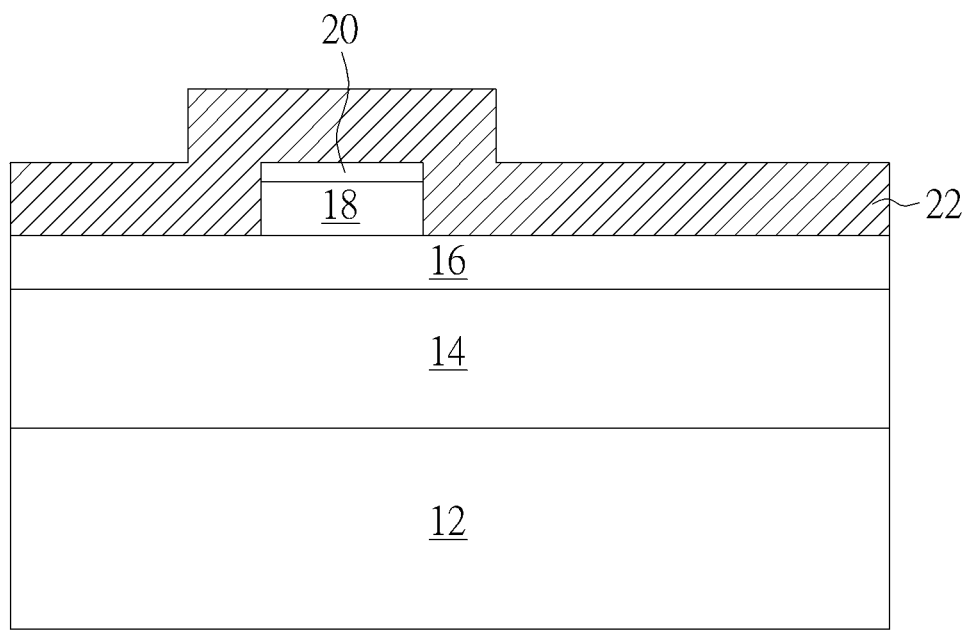

Next, as shown in FIG. 2, a compressive stress layer 22 is formed on the barrier layer 16 and covering the passivation layer 20 and the p-type semiconductor layer 18 including the top surface of the passivation layer 20 and sidewalls of the p-type semiconductor layer 18. In this embodiment, the compressive stress layer 22 is made of silicon nitride, a thickness of the compressive stress layer 22 is approximately 100 nm, and a ratio of nitrogen-hydrogen (N—H) bond to silicon-hydrogen (Si—H) bond is between 5-20.

Figure 3:
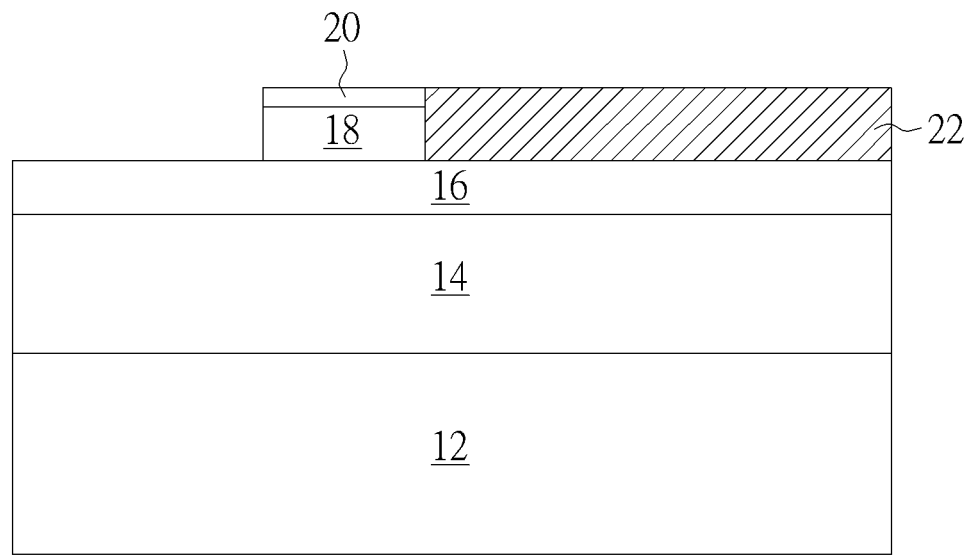

Next, as shown in FIG. 3, an etching process is conducted by using a patterned mask (not shown) such as a patterned resist as mask to remove the compressive stress layer 22 adjacent to one side of the p-type semiconductor layer 18 or more specifically the side closer to a source electrode formed afterwards. As a result, the remaining compressive stress layer 22 is disposed on another side of the p-type semiconductor layer 18 or more specifically the side closer to a drain electrode which will be formed afterwards. Preferably, the top surface of the remaining compressive stress layer 22 is even with the top surface of the passivation layer 20 or according to another embodiment of the present invention, the top surface of the remaining compressive stress layer 22 could also be slightly lower than the top surface of the passivation layer 20, which is also within the scope of the present invention.

Figure 4:
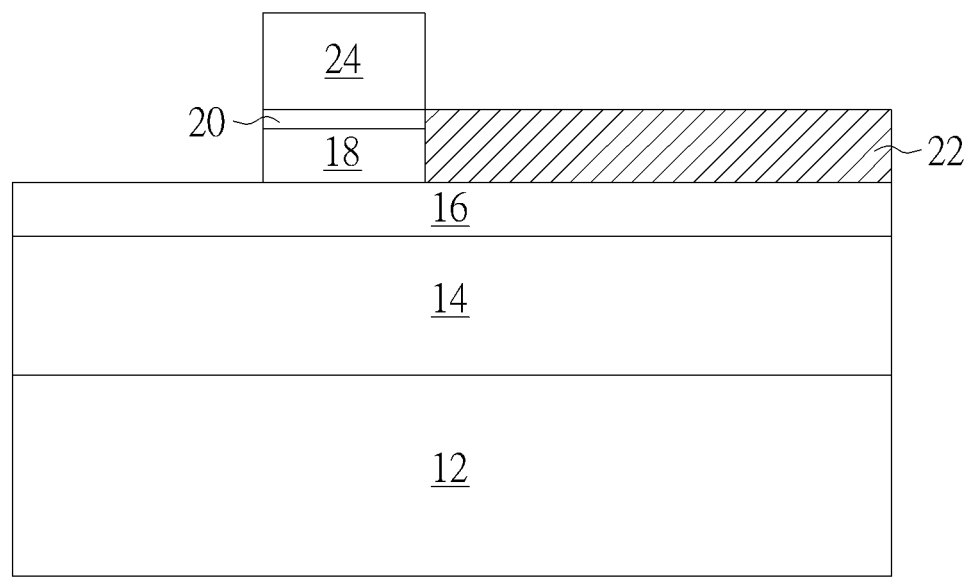
Figure 5:
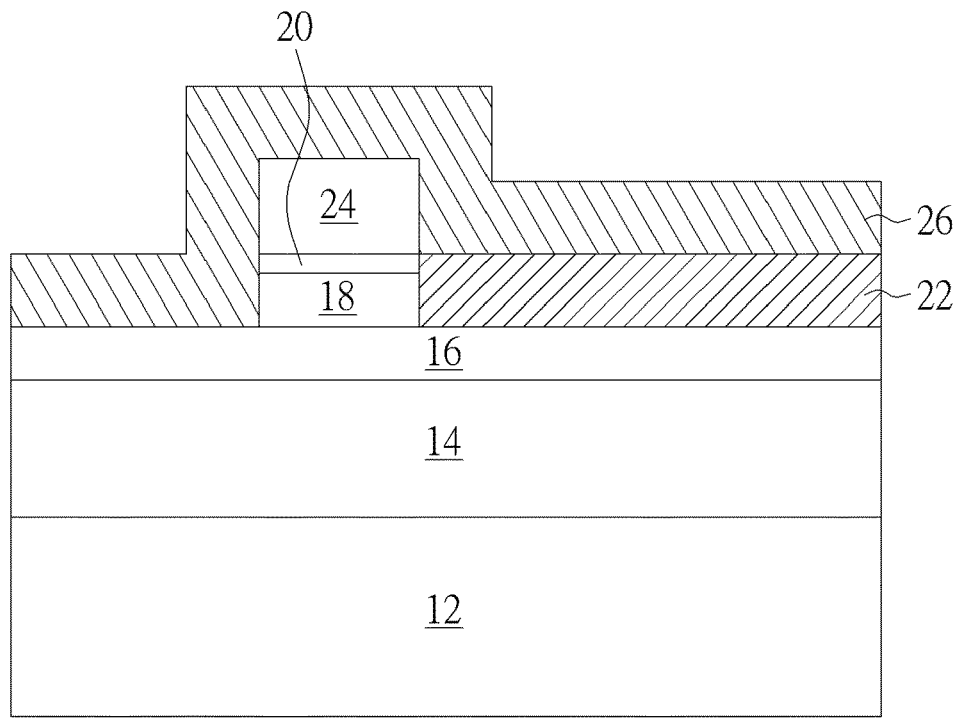

Next, as shown in FIG. 4, a gate electrode 24 is formed on the passivation layer 20, in which the gate electrode 24 is preferably made of Schottky metal. According to an embodiment of the present invention, the gate electrode 24 could include gold (Au), Silver (Ag), platinum (Pt), titanium (Ti), aluminum (Al), tungsten (W), palladium (Pd), or combination thereof. Preferably, it would be desirable to conduct an electroplating process, sputtering process, resistance heating evaporation process, electron beam evaporation process, physical vapor deposition (PVD) process, chemical vapor deposition (CVD) process, or combination thereof to form an electrode material layer on the barrier layer 16, the passivation layer 20, and the compressive stress layer 22, and then one or more etching process is conducted to pattern the electrode material layer for forming the gate electrode 24.

Next, a tensile stress layer 26 is formed to cover the barrier layer 16, the gate electrode 24, and the compressive stress layer 22 adjacent to one side of the p-type semiconductor layer 18. In this embodiment, the tensile stress layer is made of silicon nitride, a thickness of the tensile stress layer 26 is approximately 100 nm, and a ratio of nitrogen-hydrogen (N—H) bond to silicon-hydrogen (Si—H) bond is between 1-5.

Figure 6:
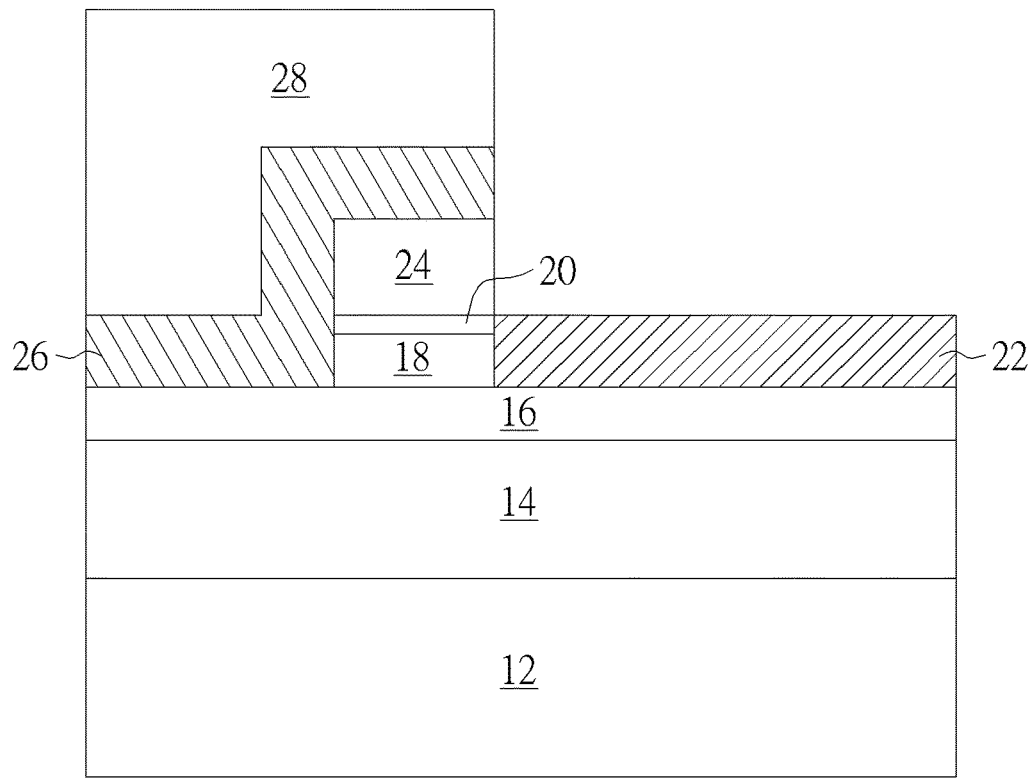

Next, as shown in FIG. 6, a patterned mask 28 such as a patterned resist is formed on the tensile stress layer 26 directly on top of the gate electrode 24 and adjacent to one side of the gate electrode 24 such as the side closer to a source electrode formed afterwards. An etching process is then conducted by using the patterned mask 28 as mask to remove part of the tensile stress layer 26 adjacent to other side of the gate electrode 24 for exposing the top surface of the compressive stress layer 22 underneath.

Figure 7:
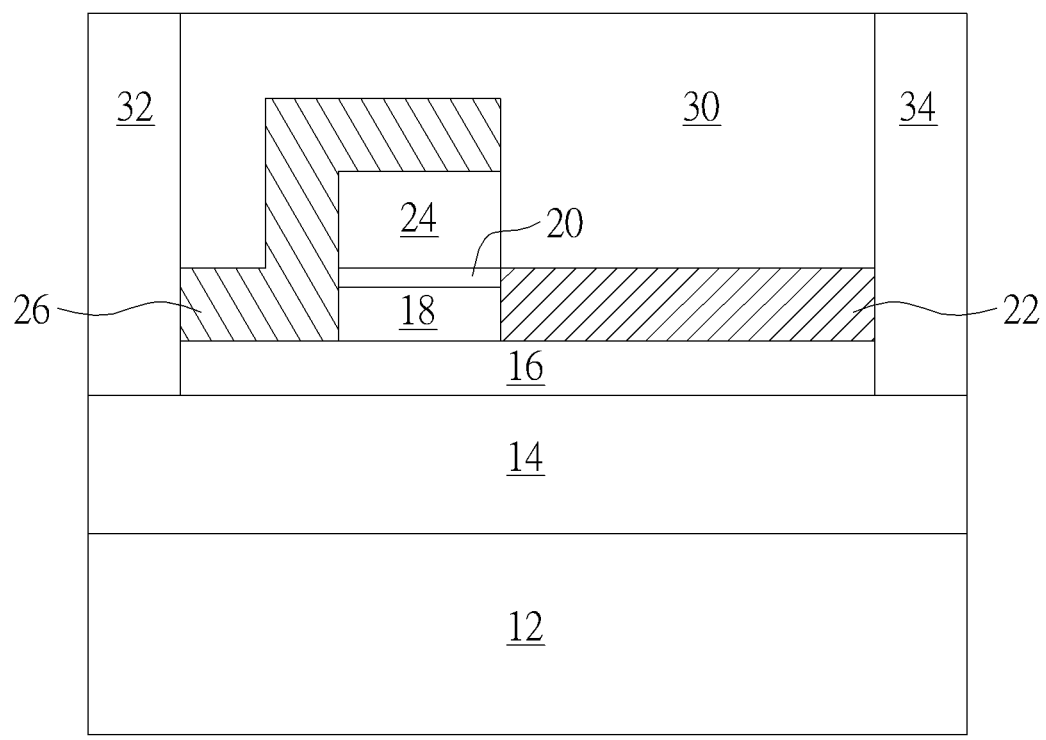

Next, as shown in FIG. 7, after removing the patterned mask 28, a dielectric layer 30 made of silicon oxide is formed on the tensile stress layer 26 and the compressive stress layer 22, and a source electrode 32 and a drain electrode 34 are formed adjacent to two sides of the gate electrode 24. In this embodiment, it would be desirable to conduct a photo-etching process to remove part of the dielectric layer 30, part of the tensile stress layer 26, part of the compressive stress layer 22, and part of the barrier layer 16 adjacent to two sides of the gate electrode 24 to form two recesses and then form the source electrode 32 and drain electrode 34 adjacent to two sides of the gate electrode 24 in the two recesses. Structurally, the source electrode 32 is disposed adjacent to and directly contacting the tensile stress layer 26 while the drain electrode 34 is disposed adjacent to and directly contacting the compressive stress layer 22. Viewing from another perspective, the tensile stress layer 26 is disposed between the gate electrode 24 and the source electrode 32 while the compressive stress layer 22 is disposed between the gate electrode 24 and the drain electrode 34.

In this embodiment, the gate electrode 24, the source electrode 32, and the drain electrode 34 are preferably made of metal, in which the gate electrode 24 is preferably made of Schottky metal while the source electrode 32 and the drain electrode 34 are preferably made of ohmic contact metals. According to an embodiment of the present invention, each of the gate electrode 24, source electrode 32, and drain electrode 34 could include gold (Au), Silver (Ag), platinum (Pt), titanium (Ti), aluminum (Al), tungsten (W), palladium (Pd), or combination thereof. Preferably, it would be desirable to conduct an electroplating process, sputtering process, resistance heating evaporation process, electron beam evaporation process, physical vapor deposition (PVD) process, chemical vapor deposition (CVD) process, or combination thereof to form electrode or conductive materials in the aforementioned recesses, and then pattern the electrode or conductive materials through one or more etching processes to form the gate electrode 24, source electrode 32, and the drain electrode 34. This completes the fabrication of a HEMT according to an embodiment of the present invention.

Overall, the present invention first forms a p-type semiconductor layer and a gate electrode on the buffer layer and barrier layer, forms a compressive stress layer on the barrier layer adjacent to one side of the gate electrode such as the side closer to the drain electrode, and then forms a tensile stress layer on the barrier layer adjacent to another side of the gate electrode such as the side closer to the source electrode, in which the thickness of the compressive stress layer and the thickness of the tensile stress layer are substantially the same. By disposing a compressive stress layer and a tensile stress layer adjacent to two sides of the gate electrode respectively for applying stress to the channel region or 2DEG, it would be desirable to increase the mobility of carriers by approximately 66%, lowers on-resistance (Ron) approximately 2.7 times, and provides a much greater cut-off frequency ($f_T$).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a high electron mobility transistor (HEMT), comprising:
   forming a buffer layer on a substrate;
   forming a barrier layer on the buffer layer;
   forming a p-type semiconductor layer on the barrier layer;
   forming a compressive stress layer adjacent to one side of the p-type semiconductor layer; and
   forming a tensile stress layer adjacent to another side of the p-type semiconductor layer.

2. The method of claim 1, further comprising:
   forming a passivation layer on the p-type semiconductor layer;
   forming the compressive stress layer on the passivation layer and the barrier layer;
   removing part of the compressive stress layer;
   forming a gate electrode on the passivation layer;
   forming the tensile stress layer on the barrier layer, the gate electrode, and the compressive stress layer;
   removing part of the tensile stress layer;
   forming a source electrode adjacent to one side of the gate electrode; and
   forming a drain electrode adjacent to another side of the gate electrode.

3. The method of claim 2, wherein the tensile stress layer is between the gate electrode and the source electrode.

4. The method of claim 2, wherein the compressive stress layer is between the gate electrode and the drain electrode.

5. The method of claim 1, wherein the compressive stress layer comprises silicon nitride.

6. The method of claim 1, wherein the tensile stress layer comprises silicon nitride.

7. A high electron mobility transistor (HEMT), comprising:
   a buffer layer on a substrate;
   a barrier layer on the buffer layer;
   a p-type semiconductor layer on the barrier layer;
   a compressive stress layer adjacent to one side of the p-type semiconductor layer; and
   a tensile stress layer adjacent to another side of the p-type semiconductor layer.

8. The HEMT of claim 7, further comprising:
   a passivation layer on the p-type semiconductor layer;
   a gate electrode on the passivation layer; and
   a source electrode and a drain electrode adjacent to two sides of the gate electrode.

9. The HEMT of claim 8, wherein the tensile stress layer is between the gate electrode and the source electrode.

10. The HEMT of claim 8, wherein the compressive stress layer is between the gate electrode and the drain electrode.

11. The HEMT of claim 7, wherein the compressive stress layer comprises silicon nitride.

12. The HEMT of claim 7, wherein the tensile stress layer comprises silicon nitride.

* * * * *